US009268673B2

(12) United States Patent
Fernandes

(10) Patent No.: US 9,268,673 B2
(45) Date of Patent: Feb. 23, 2016

(54) LOAD TESTING ONLINE GAME SERVER ENVIRONMENT USING WEB-BASED INTERFACE

(75) Inventor: Brian Fernandes, San Diego, CA (US)

(73) Assignee: Sony Computer Entertainment America Inc., Foster City, CA (US)

(*) Notice: Subject to any disclaimer, the term of this patent is extended or adjusted under 35 U.S.C. 154(b) by 784 days.

(21) Appl. No.: 12/908,731

(22) Filed: Oct. 20, 2010

(65) Prior Publication Data
US 2012/0101799 A1  Apr. 26, 2012

(51) Int. Cl.
G06F 9/44 (2006.01)
G06F 13/10 (2006.01)
G06F 13/12 (2006.01)
G06F 11/36 (2006.01)
G06F 3/0482 (2013.01)
G06F 17/50 (2006.01)
G06F 11/34 (2006.01)

(52) U.S. Cl.
CPC .......... *G06F 11/3688* (2013.01); *G06F 3/0482* (2013.01); *G06F 11/3414* (2013.01); *G06F 11/3495* (2013.01); *G06F 17/5009* (2013.01); G06F 2201/875 (2013.01)

(58) Field of Classification Search
CPC .......................... G06F 3/0482; G06F 17/5009
USPC .......................................................... 703/21
See application file for complete search history.

(56) References Cited

U.S. PATENT DOCUMENTS

| 5,812,780 | A | * | 9/1998 | Chen et al. ..................... 709/224 |
| 6,421,424 | B1 | * | 7/2002 | Creamer et al. ........... 379/15.01 |
| 8,954,546 | B2 | * | 2/2015 | Krajec ........................... 709/220 |
| 2003/0182408 | A1 | * | 9/2003 | Hu .................................. 709/223 |
| 2005/0170891 | A1 | * | 8/2005 | Shim et al. ....................... 463/42 |
| 2006/0154710 | A1 | * | 7/2006 | Serafat ............................... 463/1 |
| 2010/0138813 | A1 | * | 6/2010 | Kim et al. ...................... 717/131 |
| 2011/0130205 | A1 | * | 6/2011 | Cho et al. ......................... 463/42 |
| 2011/0151954 | A1 | * | 6/2011 | Bae et al. ........................... 463/1 |

OTHER PUBLICATIONS

Ossian Roge, NPL publication, "Integration of Virtual players into a pedagogical simulator", Apr. 2004.*
John Gannon, NPL, "Why cloud-based load testing is a killer app", Mar. 4, 2009.*

* cited by examiner

*Primary Examiner* — Omar Fernandez Rivas
*Assistant Examiner* — Angel Calle
(74) *Attorney, Agent, or Firm* — Procopio Cory Hargreaves & Savitch LLP

(57) ABSTRACT

Load testing an online game server environment using a web-based interface includes: configuring a load test with configuration parameters including client behavior parameters and server parameters, wherein the client behavior parameters provide settings for various behaviors such as cheating and aggressiveness, and wherein the server parameters provide a setup for server states and messages; building and deploying simulation client and game server binaries; scheduling and running the load test; and collecting test data output from the load test. Keywords include load test automation, load test service, load test resource management.

19 Claims, 5 Drawing Sheets

LOAD TESTING ONLINE GAME SERVER ENVIRONMENT USING WEB-BASED INTERFACE

BACKGROUND

1. Field of the Invention

The present invention relates to load testing, and more specifically, to load testing an online game server environment using a web-based interface.

2. Background

Load testing products exist to show how a particular application or server performs in a real-world scenario. These load testing products have various types of tests that can be performed to assess system performance, such as tests that determine at what point the system slows down dramatically. However, these load testing products are very work intensive, cumbersome, and require multiple resources to complete a single load test and analyze results.

SUMMARY

The present invention provides for load testing an online game server environment using a web-based interface.

In one implementation, a method of load testing an online game server environment using a web-based interface is disclosed. The method includes: configuring a load test with configuration parameters including client behavior parameters and server parameters, wherein the client behavior parameters provide settings for various behaviors such as cheating and aggressiveness, and wherein the server parameters provide a setup for server states and messages; building and deploying simulation client and game server binaries; scheduling and running the load test; and collecting test data output from the load test.

In another implementation, a non-transitory tangible storage medium storing a computer program for load testing an online game server environment using a web-based interface is disclosed. The computer program includes executable instructions that cause a computer to: configure a load test with configuration parameters including client behavior parameters and server parameters, wherein the client behavior parameters provide settings for various behaviors such as cheating and aggressiveness, and wherein the server parameters provide a setup for server states and messages; build and deploy simulation client and game server binaries; schedule and run the load test; and collect test data output from the load test.

Other features and advantages of the present invention will become more readily apparent to those of ordinary skill in the art after reviewing the following detailed description and accompanying drawings.

DETAILED DESCRIPTION

Certain implementations as disclosed herein provide for load testing an online game server environment using a web-based interface to insure stability and/or scalability of an online game network. The online game environment includes, but not be limited to, arcade games, simulations, massively multi-player online games (MMOG), virtual reality, avatar communications, interactive television overlays, and games with motion sensing and on various devices. Further, these games, devices, and concepts are considered to be included in the online game environment whether such games, devices, and concepts provide or contribute to, in full or part, an entertainment or simulation experience.

After reading this description it will become apparent how to implement the invention in various implementations and applications. However, although various implementations of the present invention will be described herein, it is understood that these implementations are presented by way of example only, and not limitation. As such, this detailed description of various implementations should not be construed to limit the scope or breadth of the present invention.

In one implementation, resources are allotted to load test online game server environments. For example, the load testing can require simulation of an online game environment involving over 50,000 players as accurately as possible. The steps of a load test can be automated and configured in such a way as to provide management of load tests via a web interface which allows an end user to configure and schedule a load test to run at a specific time, have the test executed and analyzed, and then receive test reports via email and/or a mobile device. The configuration of the automatic load test includes a server framework which interacts with various server-based resources to complete the load test process.

Figure 1:
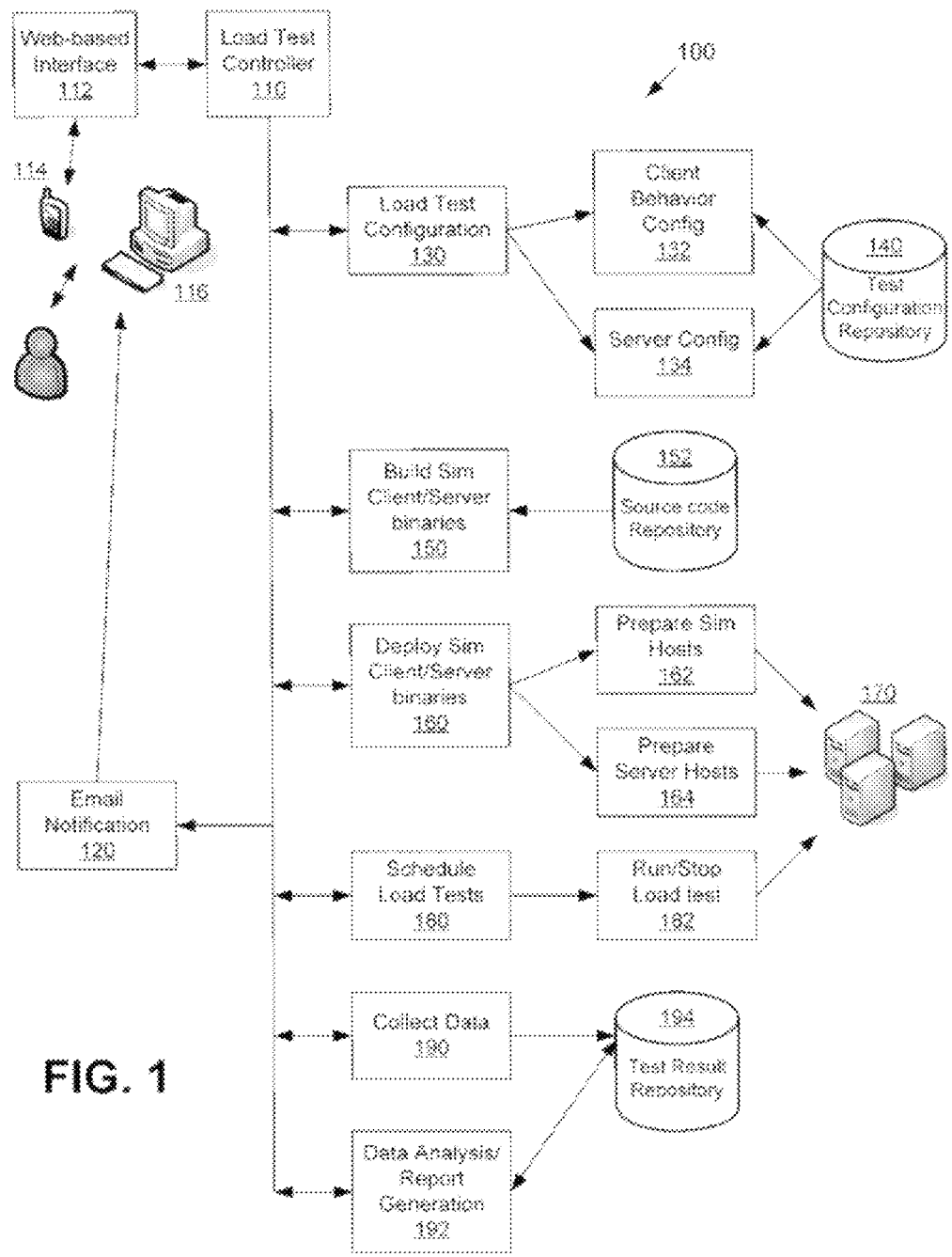
FIG. 1 is a block diagram of a load testing framework to load test an online game server environment to insure stability and/or scalability of an online game network in accordance with one implementation of the present invention.

FIG. 1 is a block diagram of a load testing framework 100 for an online game server environment using a web-based interface in accordance with one implementation of the present invention. In the illustrated implementation, the load testing framework 100 includes a load test controller 110 and a web-based interface 112. The load test controller 110 can be configured as a software application that manages execution steps or a work flow required to manage a load test, which may interact with external hardware resources such as server hosts and data repositories as needed to complete its tasks. The web-based interface 112 can support creation and/or scheduling of load tests. In one implementation, the load test execution steps include: load test configuration 130; build simulation client and game server binary 150; deploy simulation client and game server binary 160; schedule load test 180; collect data 190; and data analysis and/or report generation 192.

The load test configuration step 130, in one implementation, sets up major attributes of the load test. For example, the major attributes include a maximum player count to be simulated, a game title to load tested, a simulation client version, and a game server version. Further, the load test configuration step 130 can include a client behavior configuration step 132 and a server configuration step 134. The client behavior configuration step 132 provides settings for various client behaviors such as cheating and aggressiveness. The server configuration step 134 provides a setup for server states and messages. The settings can be saved and/or retrieved to and from a test configuration repository 140 for storage and reuse.

The build simulation client and game server binary step 150, in one implementation, builds source code or pre-built binaries which can be retrieved from a source code repository 152 (e.g., Current Version System (CVS), Perforce, and Subversion (SVN)).

The deploy simulation client and game server binary step 160, in one implementation, deploys to physical hosts binaries acquired in the build simulation client and game server binary step 150. The deployment is carried out according to the load test configuration performed in step 130. Further, the deploy simulation client and game server binary step 160 includes a prepare simulation hosts step 162 which prepares simulation hosts and a prepare server hosts step 164 which prepares server hosts. The prepared hosts are then hosted on cloud or internally-hosted servers 170.

The schedule load test step 180, in one implementation, schedules a load test based on the load test configuration step 130. Then, a run/stop load test step 182 is executed based on schedule preferences selected by a user. The load test is hosted on cloud or internally-hosted servers 170.

After the load test is completed, the collect data step 190, in one implementation, is executed to load test data collected from the simulation client and server hosts. The test data is then stored in a test result repository 194 for analysis.

In one implementation, the stored test data is retrieved from the test result repository 194 and is analyzed for a variety of purposes and reports generated by the data analysis/report generation step 192. The purposes of the analysis include error conditions, server health during test, and simulation client metrics. The report is generated from the analysis and sent via the delivery methods specified by the user at the load test configuration step 130.

The web-based interface 112, in one implementation, is configured to receive inputs from various input devices including a cellular device 114 and/or a computer 116. The web-based interface 112 performs user registration and profile management as well as load test management. The user registration and profile management function allows the user to create an account and manage a profile that includes email addresses and a list of destination devices for load test notifications. The load test management function creates, edits, and schedules load tests.

Figure 2:
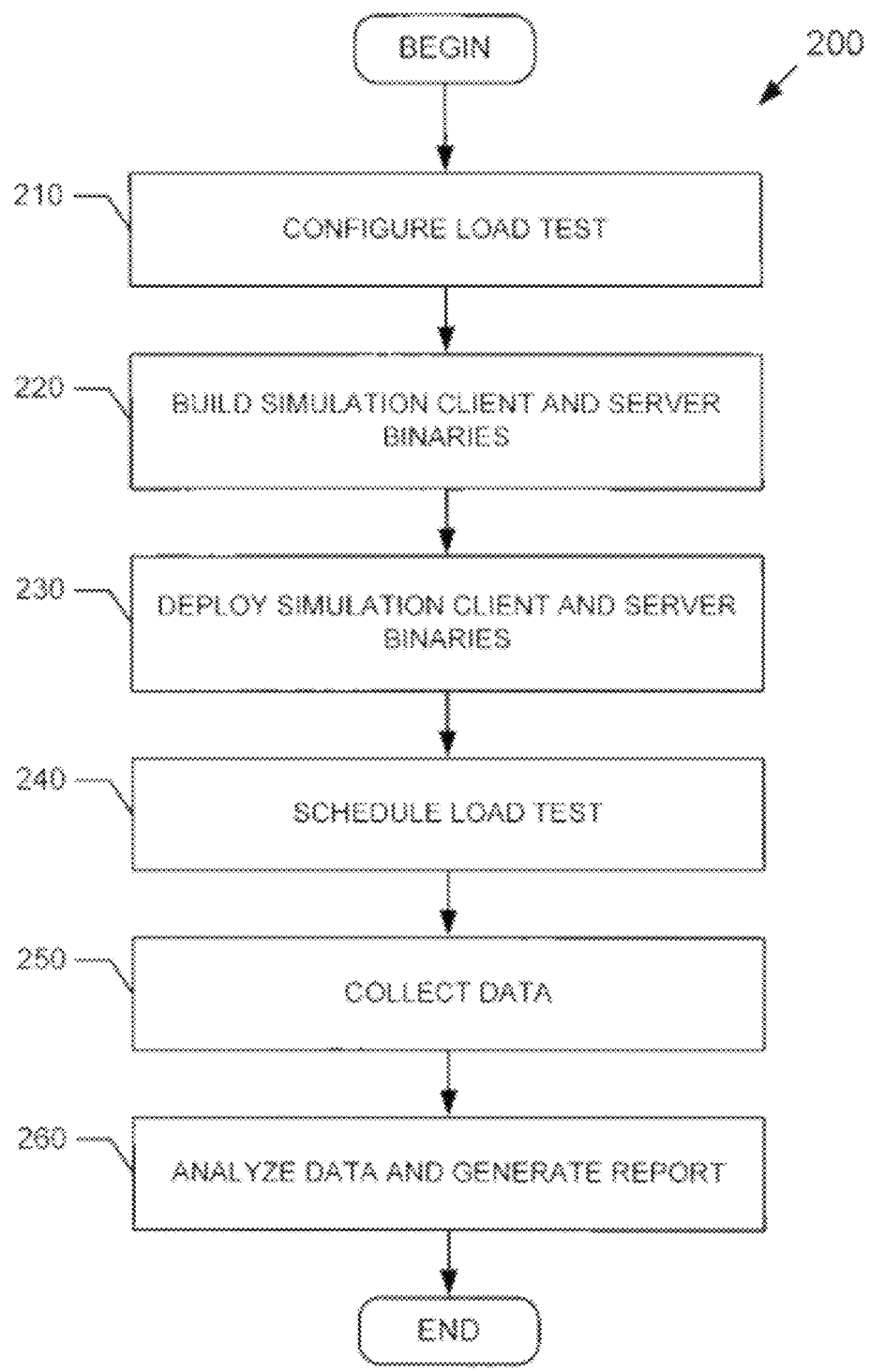
FIG. 2 is a flowchart illustrating a process for load testing an online game server environment to insure stability and/or scalability of an online game network in accordance with one implementation of the present invention.

FIG. 2 is a flowchart illustrating a process 200 for load testing an online game server environment using a web-based interface to insure stability and/or scalability of an online game network in accordance with one implementation of the present invention. In the illustrated implementation, the load testing process 200 is initiated with configuration of a load test, at box 210, using configuration parameters. In one implementation, major attributes of the load test is set up by the load test configuration step. For example, the major attributes include a maximum player count to be simulated, a game title to load tested, a simulation client version, and a game server version.

Figure 3A:
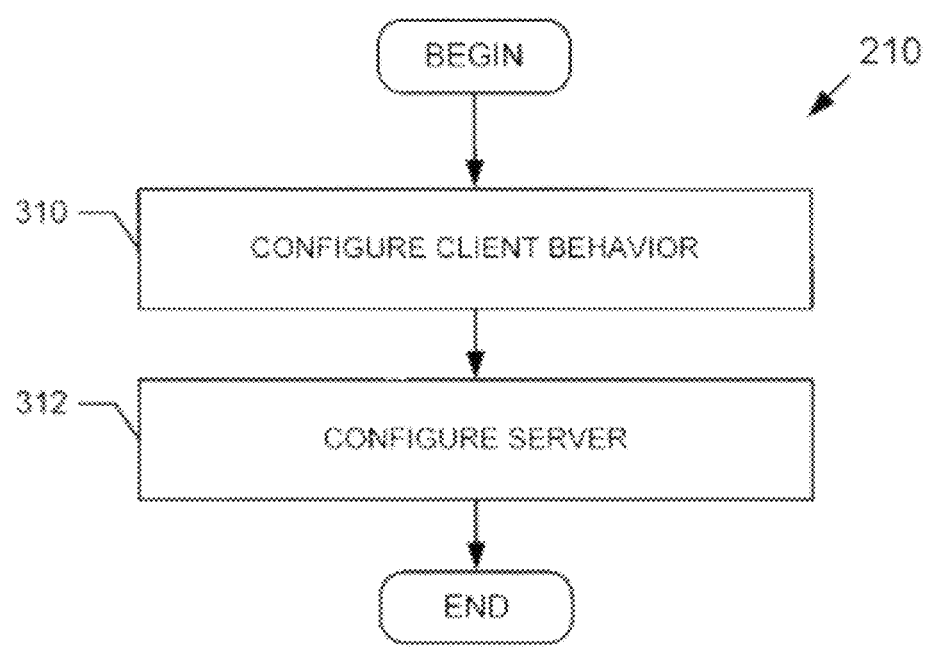
FIG. 3A shows further steps for the load test configuration including configuring of a client behavior and configuring of a server.

FIG. 3A shows further steps for the load test configuration 210 including configuring of a client behavior, at box 310, using client behavior parameters, and configuring of a server, box 312, using server parameters. The client behavior parameters provide settings for various behaviors such as cheating and aggressiveness. The server parameters provide a setup for server states and messages. The settings can be saved and/or retrieved to and from a test configuration repository 140 for storage and reuse.

Referring back to FIG. 2, simulation client and game server binaries are built, at box 220. In this step, source codes or binaries which can be retrieved from a source code repository 152 are built. Then, at box 230, the previously-built simulation client and game server binaries are deployed to physical hosts. The deployment is carried out according to the load test configuration performed at box 210.

Figure 3B:
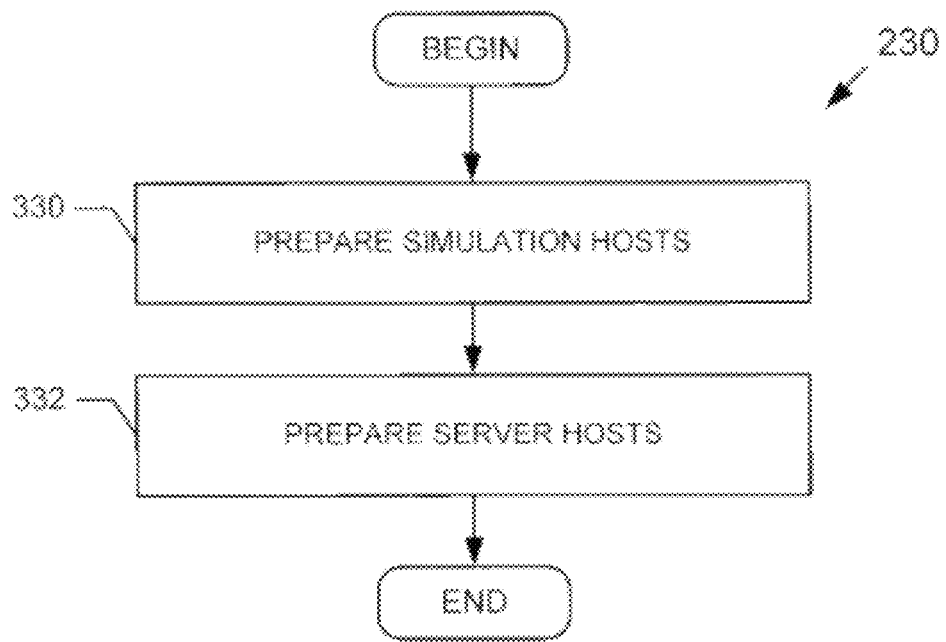
FIG. 3B shows further steps for the deployment of previously-built simulation client and game server binaries including preparing simulation hosts which prepares simulation hosts, and preparing server hosts which prepares server hosts.

FIG. 3B shows further steps for the deployment of previously-built simulation client and game server binaries (at box 230) including preparing simulation hosts, at box 330, which prepares simulation hosts, and preparing server hosts, at box 332, which prepares server hosts. The prepared hosts are then hosted on cloud or internally-hosted servers 170.

Figure 3C:
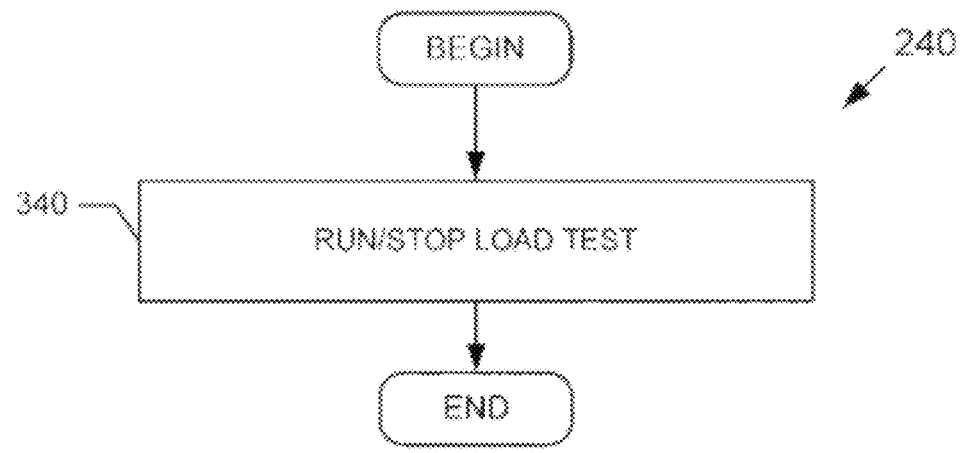
FIG. 3C shows a further step for load test scheduling including a run/stop load test step which is executed based on schedule preferences selected by a user.

Referring back to FIG. 2, the load test is scheduled, at box 240, based on the load test configuration performed at box 210. FIG. 3C shows a further step for load test scheduling (at box 240) including a run/stop load test step, at box 340, which is executed based on schedule preferences selected by a user. The load test is then hosted on cloud or internally-hosted servers 170.

Referring back to FIG. 2 again, after the load test is completed, the test data is collected, at box 250, and is then stored in a test result repository 194 for analysis.

In one implementation, the stored test data is retrieved from the test result repository 194 and is analyzed for a variety of purposes, at box 260. The analyzed data is then used to generate report(s). The purposes of the analysis include error conditions, server health during test, and simulation client metrics. The report is generated from the analysis and sent via the delivery methods specified by the user.

Figure 4A:
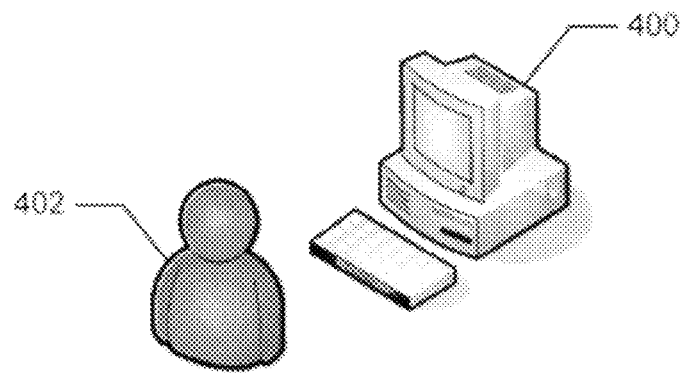
FIG. 4A illustrates a representation of a computer system and a user.

FIG. 4A illustrates a representation of a computer system 400 and a user 402. The user 402 uses the computer system 400 to perform a load test to insure stability and/or scalability of an online game network. The computer system 400 stores and executes a load test control 490.

Figure 4B:
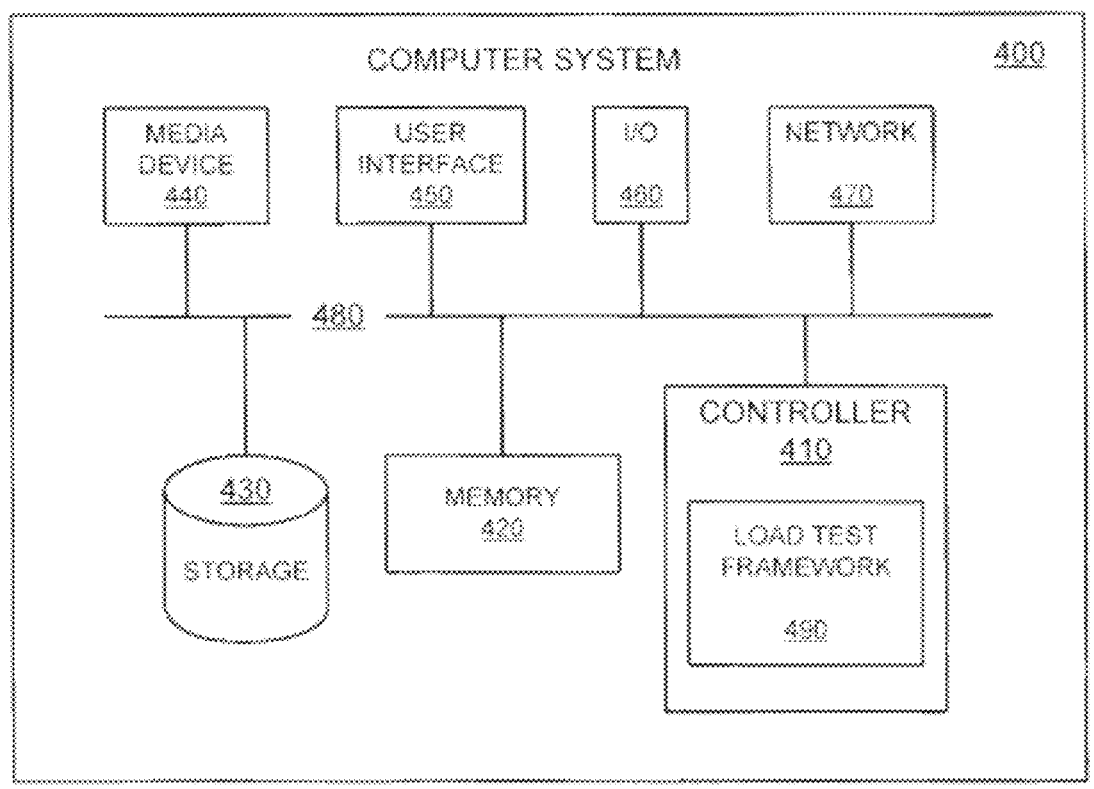
FIG. 4B is a functional block diagram illustrating the computer system hosting the load test control.

FIG. 4B is a functional block diagram illustrating the computer system 400 hosting the load test control 490. The controller 410 is a programmable processor and controls the operation of the computer system 400 and its components. The controller 410 loads instructions (e.g., in the form of a computer program) from the memory 420 or an embedded controller memory (not shown) and executes these instructions to control the system. In its execution, the controller 410 provides the load test control 490 as a software system. Alternatively, this service can be implemented as separate hardware components in the controller 410 or the computer system 400.

Memory 420 stores data temporarily for use by the other components of the computer system 400. In one implementation, memory 420 is implemented as RAM. In one implementation, memory 420 also includes long-term or permanent memory, such as flash memory and/or ROM.

Storage 430 stores data temporarily or long term for use by other components of the computer system 400, such as for storing data used by the load test control 490. In one implementation, storage 430 is a hard disk drive.

The media device 440 receives removable media and reads and/or writes data to the inserted media. In one implementation, for example, the media device 440 is an optical disc drive.

The user interface 450 includes components for accepting user input from the user of the computer system 400 and presenting information to the user. In one implementation, the user interface 450 includes a keyboard, a mouse, audio speakers, and a display. The controller 410 uses input from the user to adjust the operation of the computer system 400.

The I/O interface 460 includes one or more I/O ports to connect to corresponding I/O devices, such as external storage or supplemental devices (e.g., a printer or a PDA). In one implementation, the ports of the I/O interface 460 include ports such as: USB ports, PCMCIA ports, serial ports, and/or parallel ports. In another implementation, the I/O interface 460 includes a wireless interface for communication with external devices wirelessly.

The network interface 470 includes a wired and/or wireless network connection, such as an RJ-45 or "Wi-Fi" interface (including, but not limited to 802.11) supporting an Ethernet connection.

The computer system 400 includes additional hardware and software typical of computer systems (e.g., power, cooling, operating system), though these components are not specifically shown in FIG. 4B for simplicity. In other implementations, different configurations of the computer system can be used (e.g., different bus or storage configurations or a multi-processor configuration).

The above description of the disclosed implementations is provided to enable any person skilled in the art to make or use the invention. Various modifications to these implementations will be readily apparent to those skilled in the art, and the generic principles described herein can be applied to other implementations without departing from the spirit or scope of the invention. Accordingly, additional implementations and variations are also within the scope of the invention. Further, it is to be understood that the description and drawings presented herein are representative of the subject matter which is broadly contemplated by the present invention. It is further understood that the scope of the present invention fully encompasses other implementations that may become obvious to those skilled in the art and that the scope of the present invention is accordingly limited by nothing other than the appended claims.

The invention claimed is:

1. A method of load testing an online game server environment using a web-based interface, the method comprising:
   configuring a load test with configuration parameters including client behavior parameters and server parameters,
   wherein the client behavior parameters provide settings for various behaviors including cheating and aggressiveness,
   wherein the server parameters provide a setup for server states and messages, and
   wherein the configuration parameters are selected to enable the load test to provide assurance of scalability of the online game server environment;
   building a software application to initiate and control the load test,
   wherein the software application is built in accordance with the configuration parameters for the load test, and
   wherein the software application is built to generate test data resulting from the load test;
   hosting the load test on cloud to perform the load test on cloud applications running on the online game server environment;
   running the software application using the web-based interface to initiate and control the load test, and to generate test data resulting from the load test;
   storing the test data in a test result repository; and
   analyzing the test data for server health during the load test and simulation client metrics.

2. The method of claim 1, wherein said configuring a load test comprises
   setting up attributes of the load test.

3. The method of claim 2, wherein the attributes of the load test comprise
   a maximum player count to be simulated.

4. The method of claim 2, wherein the attributes of the load test comprise
   a game title to be load tested.

5. The method of claim 2, wherein the attributes of the load test comprise
   a simulation client version and a game server version.

6. The method of claim 1, wherein building a software application comprises
   building source codes according to the configuration parameters.

7. The method of claim 6, wherein building source codes comprises
   deploying the source codes and preparing simulation hosts and server hosts on the cloud.

8. The method of claim 1, wherein the web-based interface is configured to receive inputs from various input devices including a cellular device and/or a computer.

9. The method of claim 1, wherein the web-based interface performs registration and profile management which allows a user to create an account and manage a profile that includes email addresses and a list of destination devices for notifications of the load test.

10. The method of claim 1, wherein the web-based interface creates, edits, and schedules the load test using the software application.

11. A non-transitory tangible storage medium storing a computer program for load testing an online game server environment using a web-based interface, the computer program comprising executable instructions that cause a computer to:
    configure a load test with configuration parameters including client behavior parameters and server parameters,
    wherein the client behavior parameters provide settings for various behaviors including cheating and aggressiveness,
    wherein the server parameters provide a setup for server states and messages, and
    wherein the configuration parameters are selected to enable the load test to provide assurance of scalability of the online game server environment;
    build a software application to initiate and control the load test,
    wherein the software application is built in accordance with the configuration parameters for the load test, and
    wherein the software application is built to generate test data resulting from the load test;
    host the load test on cloud to perform the load test on cloud applications running on the online game server environment;
    run the software application using the web-based interface to initiate and control the load test, and to generate test data resulting from the load test;
    store the test data in a test result repository; and
    analyze the test data for server health during the load test and simulation client metrics.

12. The non-transitory tangible storage medium of claim 11, wherein executable instructions that cause a computer to configure a load test comprise executable instructions that cause a computer to
    set up attributes of the load test.

13. The non-transitory tangible storage medium of claim 12, wherein the attributes of the load test comprise a maximum player count to be simulated.

14. The non-transitory tangible storage medium of claim 12, wherein the attributes of the load test comprise a game title to be load tested.

15. The non-transitory tangible storage medium of claim 11, wherein executable instructions that cause a computer to build a software application comprise executable instructions that cause a computer to
build source codes according to the configuration parameters.

16. The non-transitory tangible storage medium of claim 15, wherein executable instructions that cause a computer to build source codes comprise executable instructions that cause a computer to
deploy the source codes and prepare simulation hosts and server hosts on the cloud.

17. The non-transitory tangible storage medium of claim 11, wherein the web-based interface is configured to receive inputs from various input devices including a cellular device and/or a computer.

18. The non-transitory tangible storage medium of claim 11, wherein the web-based interface performs registration and profile management which allows a user to create an account and manage a profile that includes email addresses and a list of destination devices for notifications of the load test.

19. The non-transitory tangible storage medium of claim 11, wherein the web-based interface creates, edits, and schedules the load test using the software application.

* * * * *